US012690273B2

(12) United States Patent
Roig-Guitart et al.

(10) Patent No.: US 12,690,273 B2
(45) Date of Patent: Jul. 21, 2026

(54) SWITCHING DEVICE WITH PASSIVE OVERCURRENT PROTECTION

(71) Applicant: SEMICONDUCTOR COMPONENTS INDUSTRIES, LLC, Scottsdale, AZ (US)

(72) Inventors: Jaume Roig-Guitart, Oudenaarde (BE); Rishi Krishna Balasubramanian Saraswathy, Stochholm (SE); Martin Domeij, Sollentuna (SE); Kyeongseok Park, Bucheon (KR); Soohyun Kang, Bucheon (KR); Doojin Choi, Gimpo (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 188 days.

(21) Appl. No.: 18/644,704

(22) Filed: Apr. 24, 2024

(65) Prior Publication Data

US 2025/0338632 A1    Oct. 30, 2025

(51) Int. Cl.
$H02H\ 7/122$     (2006.01)
$H02H\ 7/20$      (2006.01)
$H10D\ 89/60$    (2025.01)

(52) U.S. Cl.
CPC .......... *H10D 89/811* (2025.01); *H02H 7/122* (2013.01); *H02H 7/205* (2013.01)

(58) Field of Classification Search
CPC ...... H10D 89/811; H02H 7/122; H02H 7/205; H03K 2017/0806; H03K 17/0822
See application file for complete search history.

(56) References Cited

U.S. PATENT DOCUMENTS 4,087,848 A    5/1978   Hyink et al.
4,760,434 A    7/1988   Tsuzuki et al.
(Continued)

OTHER PUBLICATIONS

Isukapati et al. "Monolithic Integration of Lateral HV Power MOSFET with LV CMOS for SiC Power IC Technology," College of Nanoscale Science and Engineering, State University of New York Polytechnic Institute, Albany, NY, USA, The 33rd International Symposium on Power Semiconductor Devices and IC, p. 267-270, Sep. 2022.

(Continued)

*Primary Examiner* — Elim Ortiz
(74) *Attorney, Agent, or Firm* — Quinn IP Law

(57) ABSTRACT

A switching device includes a semiconductor power switch and a temperature sensitive element (TSE). The power switch has a normal operating temperature range and an active area. The TSE is connected to the power switch proximate the active area, and configured such that conduction of an electric current through the TSE is negligible when a temperature of the TSE is within the normal operating temperature range. Conduction increases when a temperature of the TSE is above the normal operating temperature range. This continues to a level sufficient for turning off the semiconductor power switch, e.g., by shorting the gate and source of the power switch. The TSE thus protects the power switch from thermal damage during an overcurrent event. An inverter circuit includes a direct current link capacitor and multiple switching pairs of the switching devices.

20 Claims, 8 Drawing Sheets

(56) References Cited

U.S. PATENT DOCUMENTS

| | | | |
|---|---|---|---|
| 2018/0062499 A1 | 3/2018 | Yamamoto et al. | |
| 2018/0065789 A1* | 3/2018 | Bazbaz | B65D 75/5838 |
| 2022/0085171 A1* | 3/2022 | Baliga | H10D 30/668 |
| 2024/0113045 A1* | 4/2024 | Saxena | H01L 23/62 |

OTHER PUBLICATIONS

Zhang et al. "Development of 4H-SiC LJFET-Based Power IC," EEE Transactions on Electron Device vol. 55, No. 8, Aug. 2008.
Akamoto et al. "First Demonstration of a Monolithic SiC Power IC Integrating a Vertical MOSFET with a CMOS Gate Buffer," 33rd International Symposium on Power Semiconductor Devices and ICs (ISPSD), May 2021.

* cited by examiner

SWITCHING DEVICE WITH PASSIVE OVERCURRENT PROTECTION

TECHNICAL FIELD

The present disclosure relates to electrical circuit topologies for protecting a semiconductor power switch during transient short-circuit conditions or other overcurrent events. In particular, the solutions described herein are passively triggered by an overtemperature state resulting from such overcurrent events.

BACKGROUND

In a high-voltage electric drive system, a direct current (DC) voltage bus is typically connected to a DC power supply, for instance a multi-cell electrochemical battery pack. Inverter circuitry connected to the DC voltage bus may be used to energize one more single-phase or polyphase electric traction motors when powering a connected load. Resident semiconductor power switches of the inverter circuitry, as well as power switches of other electrical circuits of the electric drive system such as voltage rectifiers and DC-DC converters, may at times be required to withstand significant fluctuations in operating temperature. From the perspective of the switch's structural and functional integrity, such temperature fluctuations tend to be the most extreme during overcurrent conditions.

An overcurrent condition may result from a transient short-circuit event, for instance due to errors or imprecision in timing when performing a switching control operation. The overcurrent condition rapidly increases the local temperature of active areas of any affected power switches. For this reason, an evaluation criteria referred to as short-circuit withstanding time (SCWT) is often used to evaluate the robustness of power switches across a wide range of high-power electrical systems. For a representative 1.2 kilovolt silicon carbide metal-oxide power semiconductor field-effect transistor (SiC power MOSFET), for instance, the specified SCWT may be on the order of several microseconds. Although electrical systems typically monitor current or temperature to trigger desaturation or other actively-controlled protective measures, the rapidity of local heating resulting from certain overcurrent faults minimizes the available response time.

SUMMARY

The hardware and software-based solutions described below seek to increase the available response time for handing overcurrent faults in an integrated circuit. In particular, the present solutions construct a switching device in which a passively-activated temperature sensitive element (TSE) is connected to a semiconductor-based power switch for protection of the power switch during an overcurrent event. The TSE and the power switch may be monolithically integrated on a semiconductor die to form the switching device as a unitary device. Various alternative approaches to constructing the switching device are provided herein.

The power switch may be embodied as a high-voltage transistor or transistor-based switch, such as but not limited to a metal-oxide semiconductor field-effect transistor (MOSFET) or an insulated gate bipolar transistor (IGBT). Advantages of the present disclosure may be extended to a variety of semiconductor technologies, including but not limited to silicon (Si), silicon carbide (SiC), gallium nitride (GaN), and gallium oxide ($Ga_2O_3$), with SiC MOSFET implementations of the power switch as described below being representative and non-limiting of the present teachings.

As contemplated herein, the TSE turns on and conducts electric current in response to a threshold high local temperature that is experienced by the switching device during an overcurrent condition. Passive activation of the TSE causes the TSE to turn off the power switch, thereby protecting the power switch from thermal damage from a temporarily excessive current. The passive approach described below acts rapidly relative to actively-controlled overcurrent protection measures. Nevertheless, active approaches may be used subsequent to passive activation of the TSE, e.g., to provide an additional level of protection and verification.

An aspect of the disclosure includes a switching device having a semiconductor power switch and the above-noted TSE. The power switch has an active area, for instance between p-type body ("PBody") regions of the above-noted exemplary SiC power MOSFET. The TSE is positioned in close proximity to the active area so that the TSE is quickly heated in conjunction with the power switch during the targeted overcurrent condition.

Conduction of an electric current through the TSE is negligible so long as a local temperature of the power switch, and thus of proximate TSE, remains within a defined normal operating temperature range of the power switch. However, when the power switch heats up due to the transient overcurrent condition, heat is transferred to the TSE. Conduction of the electric current increases as the temperature of the TSE increases above the normal operating temperature, with the increased electric current being sufficient for turning off the connected power switch, e.g., 10 milliamps (mA) to 100 mA or more in one or more implementations.

The TSE may optionally include a junction field-effect transistor (JFET), for example a lateral JFET or a gated lateral JFET. In other embodiments, the TSE may be constructed as a polysilicon element such as a diode, a thyristor, a bipolar junction transistor (BJT), or as a thin-film transistor (TFT). Consumed active area and any impact on the drain-to-source on-state resistance (RDSON) are expected to be small relative to purely actively-triggered alternatives, including those which seek to limit current flow through the protected power switch during an overcurrent event by increasing the level of resistance in a conduction path, as appreciated in the art.

The above summary is not intended to represent every embodiment or aspect of the present disclosure. Rather, the foregoing summary exemplifies certain novel aspects and features as set forth herein. The above noted and other features and advantages of the present disclosure will be readily apparent from the following detailed description of representative embodiments and modes for carrying out the present disclosure when taken in connection with the accompanying drawings and the appended claims.

BRIEF DESCRIPTION OF THE DRAWINGS

The drawings described herein are for illustrative purposes only, are schematic in nature, and are intended to be exemplary rather than to limit the scope of the disclosure.

Figure 1:
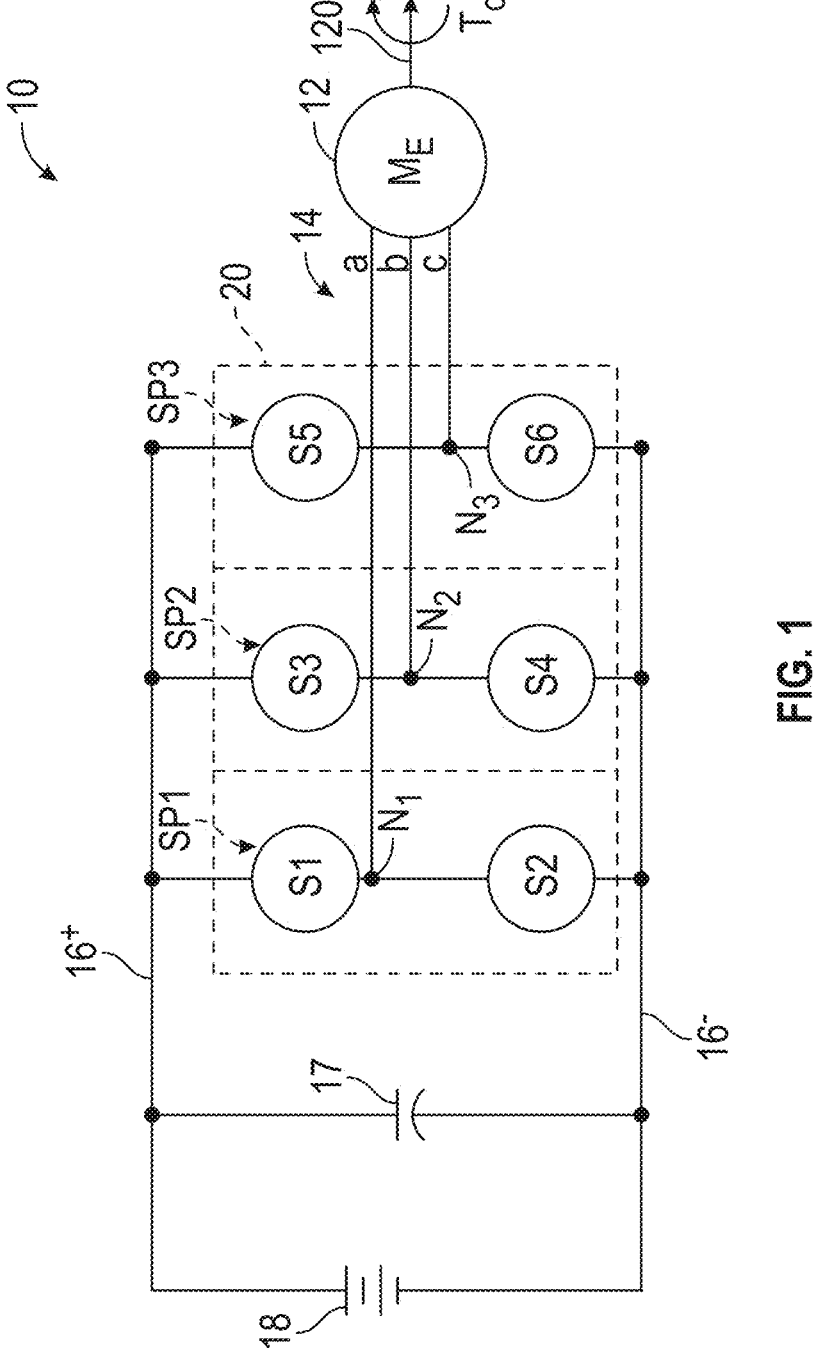
FIG. 1 illustrates an exemplary inverter circuit for a polyphase electric machine, with the inverter circuit using one or more switching devices equipped with passive overcurrent protection feature in accordance with the present disclosure.

The present disclosure may be modified or embodied in alternative forms, with representative embodiments shown in the drawings and described in detail below. Inventive aspects of the present disclosure are not limited to the disclosed embodiments. Rather, the present disclosure is intended to cover alternatives falling within the scope of the disclosure as defined by the appended claims.

DETAILED DESCRIPTION

The components of the embodiments described and illustrated herein may be arranged and designed in a variety of different configurations. Thus, the following detailed description is not intended to limit the scope of the disclosure as claimed, but is instead representative of possible embodiments thereof. In addition, while numerous specific details are set forth in the following description in order to provide a thorough understanding of the embodiments disclosed herein, some embodiments can be practiced without some of these details. Moreover, for the purpose of clarity, certain technical material that is understood in the related art has not been described in detail in order to avoid unnecessarily obscuring the disclosure.

For purposes of convenience and clarity only, directional terms such as top, bottom, left, right, up, over, above, below, beneath, rear, and front, may be used with respect to the drawings. These and similar directional terms are not to be construed to limit the scope of the disclosure. Furthermore, the disclosure, as illustrated and described herein, may be practiced in the absence of an element that is not specifically disclosed herein. The use of ordinals such as first, second and third does not necessarily imply a ranked sense of order, but may only distinguish between multiple instances of an act or structure.

With reference to the drawings, wherein like reference numbers refer to the same or similar components throughout the several views, an inverter circuit 10 is illustrated in FIG. 1 for use with an exemplary polyphase rotary electric machine (ME) 12. The inverter circuit 10 may include switching devices 20 configured to passively protect elements of the inverter circuit 10 from thermal damage during a transient overcurrent condition as summarized above. Various implementations of the switching devices 20 are set forth in detail below with reference to FIGS. 2-8C. Although the switching devices 20 may be used as part of the exemplary inverter circuit 10 of FIG. 1, those skilled in the art will appreciate that other power electronic devices may benefit from use of the switching devices 20, including voltage rectifiers, DC-DC converters, and the like, and therefore the present teachings are not limited to the representative use illustrated in FIG. 1.

The electric machine 12, e.g., an electric traction motor for powering a load in a stationary or mobile system in one or more embodiments, includes the phase leads 14, with each of the phase leads 14 being connectable to the inverter circuit 10. For example, a typical three-phase embodiment of the electric machine 12 includes three phase leads 14, which in turn are individually labeled "a", "b", and "c" to indicate nominal a, b, and c phases. The inverter circuit 10 also includes a positive voltage rail $16^+$, a negative voltage rail $16^-$ (electrical ground), and a direct current (DC) link capacitor 17. The DC link capacitor 17 is connected to the respective positive and negative voltage rails ($16^+$, $16^-$) and configured to receive a DC voltage waveform from a DC voltage supply 18, for instance a multi-cell electrochemical battery pack of an application-suitable battery chemistry such as lithium-ion, lithium-metal, nickel-metal hydride, etc.

Within the inverter circuit 10 of FIG. 1, a plurality of the semiconductor switching devices 20, also individually labeled S1, S2, S3, S4, S5, and S6 in the illustrated example construction, are arranged in multiple switching pairs SP1, SP2, and SP3, i.e., power switches (S1, S2), (S3, S4), and (S5, S6), respectively. Each respective switching pair SP1, SP2, and SP3 is connected to the DC link capacitor 17 and a corresponding phase lead 14 of the electric machine 12. That is, the switching pairs SP1, SP2, and SP3 are respectively connected to the nominal a, b, and c phase leads 14 at nodes $N_1$, $N_2$, and $N_3$.

In a normal switching operation when energizing the phase leads 14 to generate motor output torque (To) on a rotary output member 120 via the electric machine 12, the switching devices 20 connected to the positive voltage rail $16^+$, which are also referred to in the art as "upper switches", have an opposite conductive state than the switching devices 20 connected to the negative voltage rail $16^-$ or ground ("lower switches"). However, factors such as timing imprecision in a switching control process may lead to a transient overcurrent conditions in one or more of the switching devices 20. This can occur when both switching devices 20 of a given switching pair SP1, SP2, or SP3, normally commanded to opposite conductive states, are simultaneously commanded to turn on and thereby conduct electric current.

The resulting overcurrent condition is typically transient, lasting on the order of several microseconds (μs). In spite of the transiency of the overcurrent condition, however, the local temperature within an affected switching device 20 can rapidly spike to 500 degrees Celsius (° C.) or more. Protective measures may be taken as set forth herein with reference to the remaining Figures to respond to the rapidly manifesting local overtemperature condition, e.g., for short-circuit faults or other overcurrent conditions.

Figures 2, 2A:
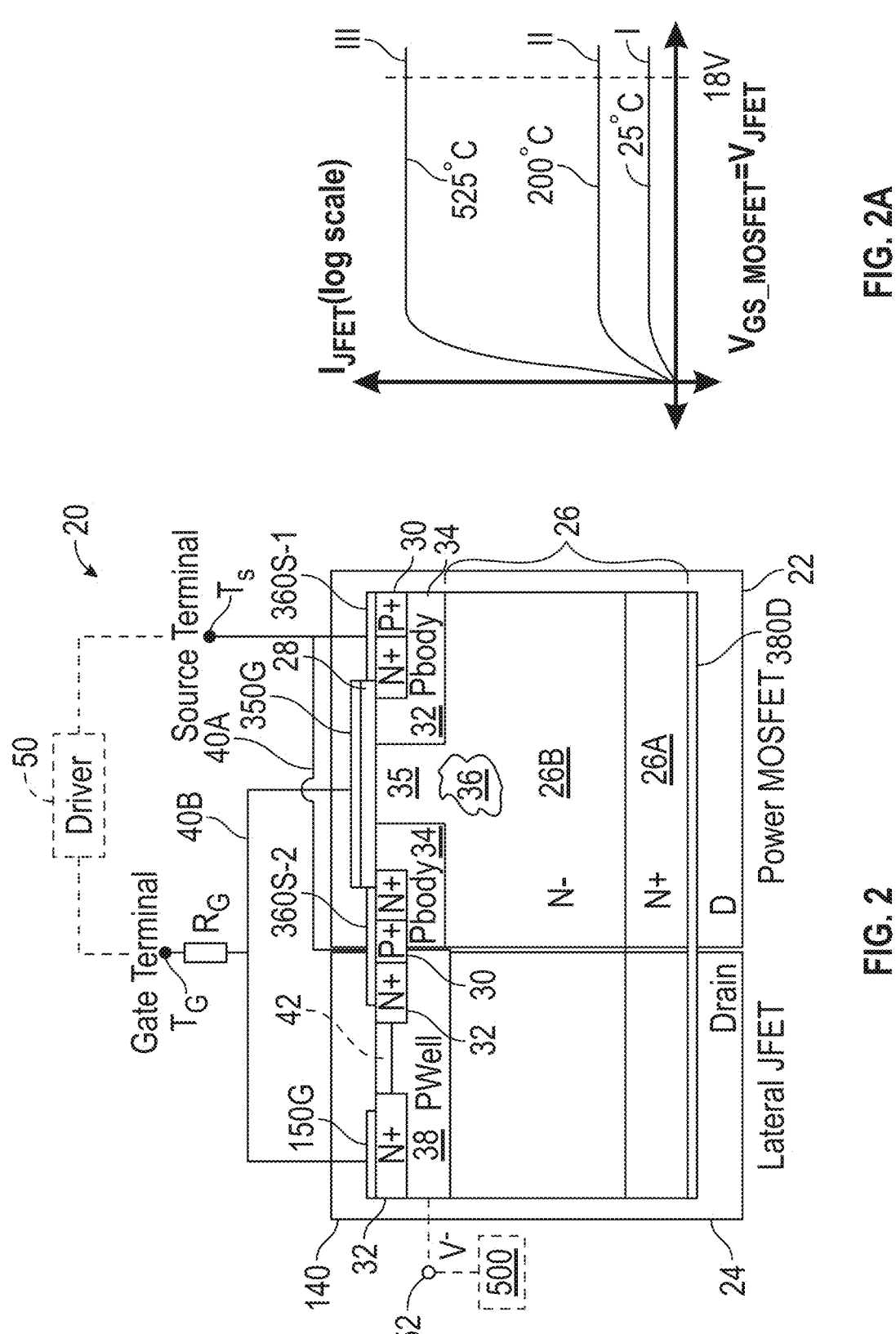
FIG. 2 is a schematic illustration of a switching device in which a semiconductor power switch is monolithically integrated with a temperature-sensitive element (TSE).
FIG. 2A is a plot of voltage, current, and temperature for a representative lateral junction field effect transistor (JFET).

Referring to FIG. 2, each respective one of the switching devices 20 of FIG. 1 includes a semiconductor power switch 22 that is connected to or monolithically integrated with a temperature sensitive element (TSE) 24. As part of the switching device 20, the TSE 24 is configured such that conduction of an electric current through the TSE 24 is negligible when an actual operating temperature of the TSE 24 is within a predetermined normal operating temperature range of the power switch 22. Electric conduction increases when the actual operating temperature of the power switch 22 exceeds an upper limit of a defined normal operating temperature range of the power switch 22. The current increase through the TSE 24 occurs rapidly, by orders of magnitude, to a level sufficient for quickly turning off the power switch 22. In this manner, use of the TSE 24 protects the power switch 22 from thermal damage during the contemplated overcurrent condition.

As alluded to above, the present disclosure facilitates a more rapid response when protecting the power switch 22 from local overtemperature conditions, i.e., relative to actively commanded or controller-based solutions such as desaturation. During desaturation, for instance, processing time is required to monitor saturation voltage of the power switch 22 against calibrated voltage thresholds to detect when the power switch 22 is no longer operating in its saturation region, as well as to command affected switches to turn off or performing a reset operation to clear the short-circuit fault. In one or more embodiments, the present passive approach can be used in conjunction with such methods, for example as an added measure of protection before resorting to active methods.

The TSE 24 of FIG. 2 as envisioned herein is positioned in close proximity to an active area 36 of the power switch 22. Due to this proximity, which may be only a few micrometers (μm), heat from the rapidly heated active area 36 will quickly transfer to the TSE 24. In turn, the resulting rapid heating of the TSE 24 will cause the conductive state of the TSE 24 to change from a blocking or non-conducting/OFF state to a conducting/ON state. This thermally-triggered conductive state change of the TSE 24 will cause the power switch 22 to turn off and no longer conduct, thereby protecting the power switch 22 from thermal damage.

Continuing with this discussion, the power switch 22 may have a normal operating temperature range of about 25° C. to about 200° C. in a representative embodiment. The threshold temperature for triggering a transition to a conductive state of the TSE 44 may therefore be the upper limit of this defined range, the values of which may be expected to vary with the construction of the power switch 22 and TSE 24. Using the above-noted threshold of 200° C. as an illustrative example, therefore, the TSE 24 would conduct a negligible current when the actual operating temperature of the power switch 22 remains close to 25° C., nominally room temperature. However, the TSE 24 would begin to conduct more current as its temperature rises to and above 200° C. Above the upper threshold of 200° C. in keeping with this non-limiting working example, the TSE 24 would conduct a significant amount of electric current, with "significant" in a practical application being on the order of 10 mA to several hundred mA, e.g., at least 100 mA.

The power switch 22 in the non-limiting example construction of FIG. 2 is embodied as a metal-oxide semiconductor field-effect transistor (MOSFET), for instance a silicon carbide (SiC) power MOSFET as shown, a trench MOSFET, a superjunction/charge balance MOSFET, etc. Other power switches 22 may be used within the scope of the disclosure, including but not limited to insulated gate bipolar transistors (IGBTs), and therefore the depicted SiC MOSFET implementations are representative and non-limiting of the present teachings.

As appreciated in the art, MOSFETs include a gate contact 350G, a source contact 360S, and a drain contact 380D. In the exemplary embodiment of FIG. 2, a silicon carbide (SiC) substrate 26 is disposed between the drain contact 380D and the source contact 360S-1 of the power switch 22. An insulating layer 28, e.g., of silicon dioxide (SO2), is disposed between the gate contact 350G and the SiC substrate 26. The SiC substrate 26 is doped, in this exemplary instance with an n-type impurity, in a first SiC substrate region 26A (N+) adjacent the drain terminal 380D.

A second SiC substrate region 26B (N−) (drift region) extends between the first SiC substrate region 26A and the insulating layer 28 below the gate contact 350G. Adjacent the source contact 360S-1, p-type and n-doped regions 30, 32 (P+ and N+) are partially surrounded by a p-type body region (PBody) 34, such that a PN junction is formed between the PBody 34 and the second SiC substrate region 26B. A channel region 35 adjacent the active area 36 is thus formed between each Pbody 34 of the power switch 22 as shown.

With continued reference to FIG. 2, the TSE 24 in this embodiment is connected to the source contact 360S-1 and the gate contact 350G of the power switch 22 in the latter's exemplary configuration as a SiC power MOSFET. The passively-activated TSE 24 in one or more implementations may include or be embodied as a lateral junction field-effect transistor (JFET) 140. Another source contact 360S-2 that is shared by the lateral JFET 140 and the power switch 22 is connected to the source contact 360S-1 via a conductor 40A, e.g., a wire trace. A similar conductor 40B connects a gate contact 150G of the lateral JFET 140 to the gate contact 350G of the power switch 22 in this embodiment. As appreciated in the art, most of the area of a die implementing the switching device 20 would be occupied by the power switch 22, such that FIG. 2 is not drawn to scale. Rather, the TSE 24 is enlarged to show its internal detail. The effect of implementing the TSE 24 on the on-state resistance or Rdson of the switching device 20 thus remains minimal, as the lateral JFET 140 contributes essentially no conduction absent an overcurrent fault.

During normal operating conditions of the switching device 20 of FIG. 2, the conductive state of the power switch 22 may be controlled via a driver circuit ("Driver") 50. That is, the driver circuit 50 provides a gate-to-source voltage ($V_{GS}$) across a gate terminal ($T_G$) and source terminal ($T_S$), with a resistor ($R_G$) connected to the gate terminal ($T_G$) to represent the internal resistance of the power switch 22 (SiC power MOSFET). The applied gate-to-source voltage causes the power switch 22 to conduct/turn on. A gate voltage signal that is less than a calibrated threshold voltage (Vth), typically 3V to 5V (or −3V to −5V) causes the power switch 22 to not conduct/turn off. Thus, in an exemplary use case in which the power switch 22 is used in a power electronic device such as an inverter circuit 10 of FIG. 1, the driver circuit 50 is used to shape an input (or output) waveform to/from the inverter circuit 10, for instance pulse width modulation, pulse density modulation, or other suitable switching control processes. As this occurs, the TSE 24 does not conduct current, and thus is seen as a slight parasitic loss element.

When the TSE 24 is embodied as the illustrated lateral JFET 140 as shown in FIG. 2, the lateral JFET 140 includes an N-channel 42 extending between two positively n-doped (N+) regions 32. A p-doped well region (PWell) 38 is located adjacent to the second SiC substrate region 26B such that the n-doped regions 32 are disposed between the respective gate and source contacts 150G and 360S-2. Under normal operating conditions, i.e., when a temperature of the lateral JFET 140 remains below an upper limit of the normal operating temperature of the power switch 22, an electric current does not flow in the N-channel 42 between the n-doped regions 32. The lateral JFET 140 instead acts in a blocking mode. As appreciated, the concentration of electrons and holes in the constituent semiconductor materials of the lateral JFET 140 increases exponentially with temperature. The depletion region of the lateral JFET is quickly reduced, which has the effect of widening the N-channel 42 and allowing more electric current to flow therethrough.

Under a concurrent high-voltage/high-current condition indicative of a short circuit fault and other possible electrical faults, however, a high power density must be dissipated as intense heat flowing laterally from the active area 36 of the power switch 22 to the N-channel 42 of the illustrated lateral JFET 140. The lateral JFET 140 responds by heating up within several μS. This causes an electric current to conduct a current laterally across the N-channel 42 from the gate contact 150G of the lateral JFET 140 to the source contact 360-2. Because the respective source contacts 360S-1 and 360S-2 are interconnected by the conductor 40A, the gate and source contacts 350G and 360S-1 of the power switch 22 are effectively shorted together, thus causing the power switch 22 to turn off.

In a possible variation, an optional positively-doped p-type (P⁺) electrode 52 contacting the Pwell 38 of the lateral JFET 140 may be used to tune performance of the lateral JFET 140. For example, a driver circuit 500 of FIG. 2 may be used to apply a small negative voltage (V⁻) to the PWell 38 to affect conductive performance of the PN junction formed between the PWell 38 and the N-channel 42. The lateral JFET 140 of FIG. 2 in one or more embodiments may be configured to conduct an electric current of less than about 1 milliamp (mA), i.e., a negligible current. This occurs when the semiconductor power switch 22 operates in its defined normal operating temperature range. The lateral JFET 140 may be configured to conduct a current of at least about 10 mA to several hundred mA in a characteristic temperature range of the overcurrent event contemplated herein, which would coincide with the power switch 22 operating well above about 200° C. in the above-stated example.

Referring briefly to FIG. 2A, which illustrates current flow traces I, II, and III across the N-channel 42 of the lateral JFET 140 shown in FIG. 2 on a logarithmic scale for different representative operating temperature curves, i.e., 25° C., 200° C., and 525° C. respectively in a non-limiting implementation. As the respective gate contacts 350G, 150G and source contacts 360S-1 and 360S-2 are connected together as shown in FIG. 2, the gate-to-source voltage of the power switch 22 ($V_{GS\_MOSFET}$) is equal to the voltage provided to the lateral JFET 140 ($V_{JFET}$).

For an exemplary scenario where $V_{GS\_MOSFET} \leq 18V$, therefore, the lateral JFET 140 conducts negligible current through the normal operating temperature range of the power switch 22, which is about 25° C. to about 200° C. in this non-limiting example. As temperatures rise during a local overtemperature event, the lateral JFET 140 begins to conduct significantly more current across the N-channel 42, thus shorting the gate contact 350G and source contact 360S-1 of the power switch 22. Use of the TSE 24 as a protective switch as contemplated herein therefore enables the TSE 24 to conduct when the power switch 22 is operating well outside of its defined normal operating temperature range, thus forcing the power switch 22 to turn off.

Figures 3, 3A:
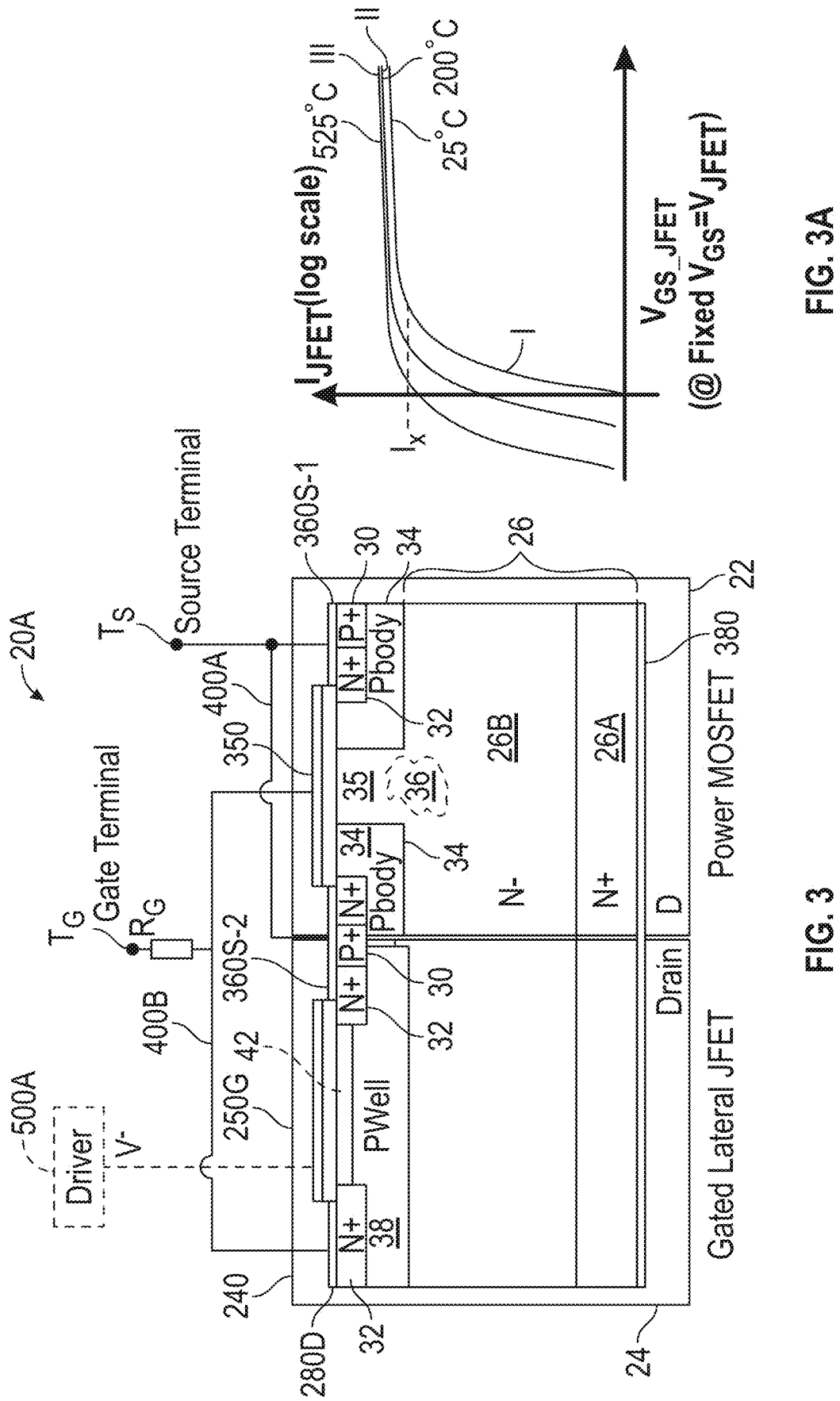
FIG. 3 is a schematic illustration of a switching device using a gated lateral JFET according to another embodiment.
FIG. 3A is a plot of voltage, current, and temperature for the representative gated lateral JFET shown in FIG. 3.

Referring now to FIG. 3, a switching device 20A may be alternatively constructed using a gated lateral JFET 240. Here, the power switch 22 may be monolithically integrated with the gated lateral JFET 240 as with the embodiment of FIG. 2. The source terminal ($T_S$) in this implementation is connected to the source contact 360S-1 of the power switch 22. The gate terminal ($T_G$) is connected to the gate contact 350G. A top gate structure 250G spans the insulator 28 covering the N-channel 42. In one or more implementations, the top gate structure 250G is electrically connected to the source contact 360S-1 of the power switch 22. A drain terminal 280D of the gated lateral JFET 240 is connected to the gate contact 350G of the power switch 22 via a conductor 400B, with a conductor 400A connecting the source contact 360S-1 to the source contact 360S-2 in this embodiment.

In one or more optional embodiments, an external connection is provided between the top gate structure 250G of the gated lateral JFET 240 and an alternatively connected driver circuit ("Driver") 50A. The driver circuit 50A may be configured as with the driver circuit 50 in FIG. 2, as well as to control a potential (V⁻) to the top gate structure 250G of the gated lateral JFET 240 to achieve a desired gate leakage current through the N-channel 42 during normal operating conditions, i.e., absent a short-circuit condition.

As shown in FIG. 3A, the switching device 20A of FIG. 3 may be used to enhance current sensitivity with respect to changing temperature, as demonstrated by the relatively concentrated grouping 51 of the temperature traces I, II, and III in contrast to how the same traces are shown in FIG. 2A. Among other attendant benefits, the switching device 20A of FIG. 3 may be relatively easy to manufacture, with its layout enabling placement of the TSE 24 close to the active area 36 of the semiconductor power switch 22. This in turn facilitates thermal energy transfer to the TSE 24 for a more rapid protection response.

Figures 4, 4A:
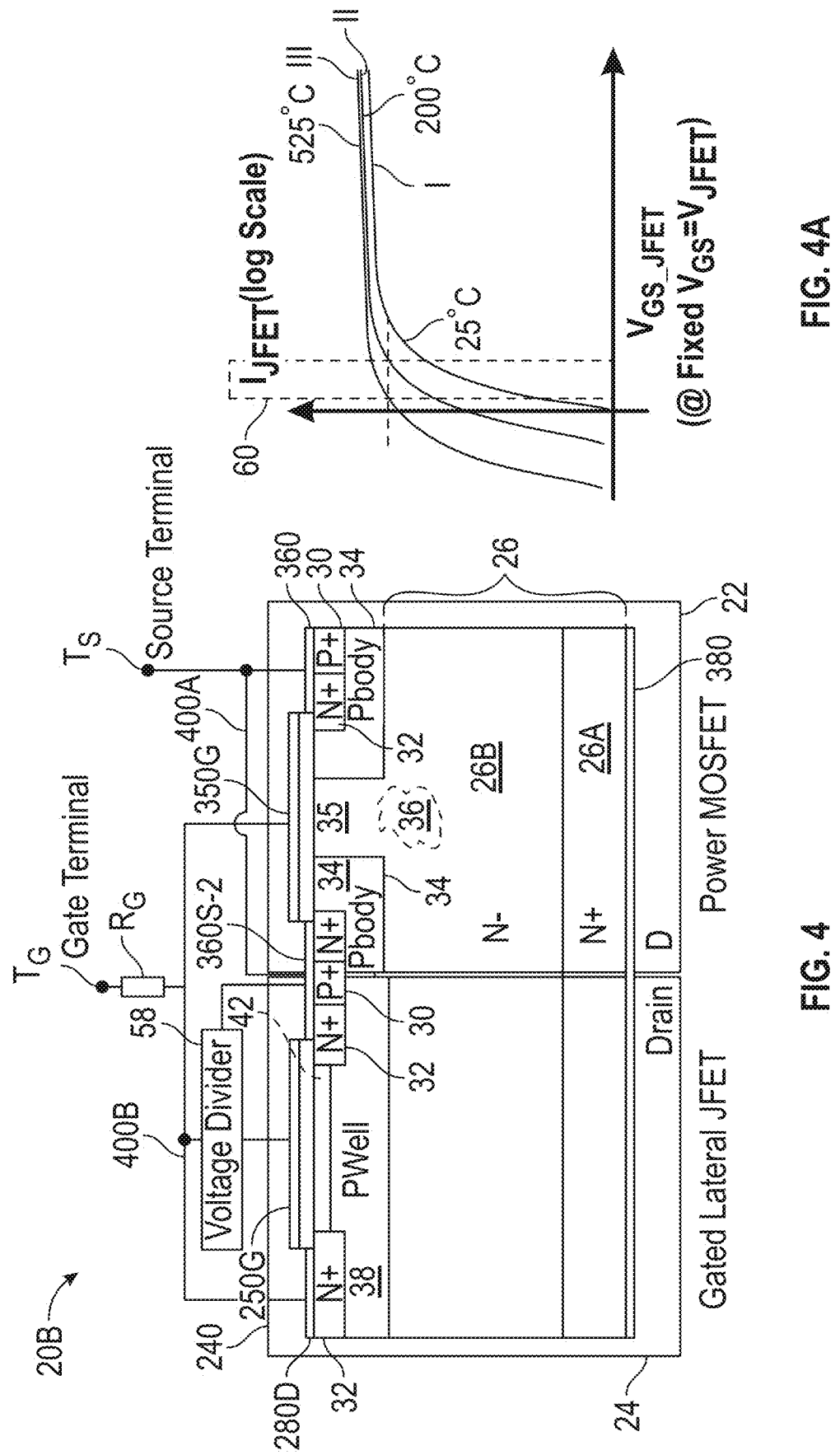
FIG. 4 is a schematic illustration of a switching device in which a voltage divider is used to reduce a gate voltage for control of the gated lateral JFET.
FIG. 4A is a plot of voltage, current, and temperature for the representative gated lateral JFET shown in FIG. 4.

In another alternative switching device 20B as illustrated in FIG. 4, the switching device 20B may include a control circuit 58 configured to adjust a current-to-temperature sensitivity level of the gated lateral JFET 24-0. For instance, the control circuit may include a voltage divider circuit coupled to the sources contacts 360S-1 and 360S-2 and the top gate structure 250G and gate contact 350G. As appreciated in the art, voltage dividers such as the schematically illustrated control circuit 58 of FIG. 3 typically arrange multiple series-connected resistors connected across a voltage source (not shown). The voltage drop across each resistor is proportional to its resistance value. The control circuit 58 may also be constructed as a capacitive divider in one or more embodiments, with a plurality of capacitors used in lieu of resistors to provide a desired reduced output gate-to-source voltage ($V_{GS\_JFET}$) to the top gate structure 250G and the source contact 360S-2 of the gated lateral JFET 240, e.g., about 0.5V to about 1V. Such an approach provides another control degree of freedom. That is, $V_{GS\_JFET}$ may be controlled with only a portion of the total gate-to-source voltage ($V_{GS}$), as represented by boxed area 60 of FIG. 4A. Such an embodiment may be used to maintain a high current sensitivity with respect to temperature and also increase current conduction, thus requiring a smaller die area for implementing the gated lateral JFET 240.

Figure 5:
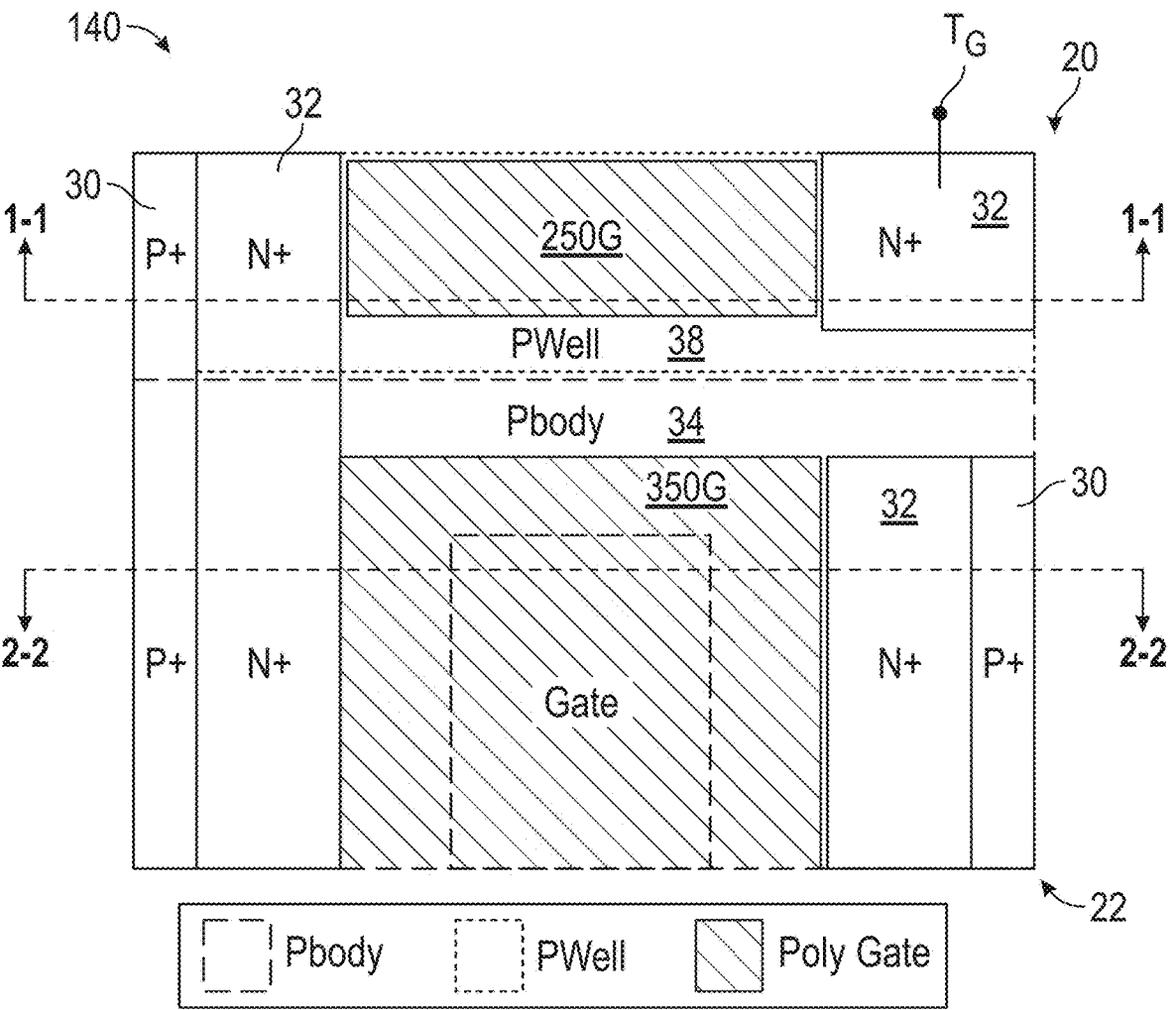
FIG. 5 is a schematic plan view illustration of a possible layout for implementing the switching device of FIGS. 3 and 4.

LAYOUT: A representative layout of the switching device 20 is shown in FIG. 5 for an embodiment in which the TSE 24 is configured as a lateral JFET 140 and the semiconductor power switch 22 is configured as a MOSFET, e.g., an SiC MOFSET. Here, the lateral JFET 140 when monolithically formed with the power switch 22 may be constructed as a continuation of layout stripes for the power MOSFET, either (i) in a transition area between active areas, or (ii) by producing interruptions within the active area. The switching device 20 taken along cut line 1-1 thus corresponds to the lateral JFET 140 illustrated in FIG. 2, with the power switch 22 of FIG. 2 taken along cut line 2-2 and with the lateral JFET 140 positioned adjacent to the power switch 22 from the perspective of FIG. 5. In the FIG. 3 embodiment in which the gated lateral JFET 240 is used, the optional poly-Si top gate structure 250G may be positioned above the PWell 38 as shown.

Figure 6C:
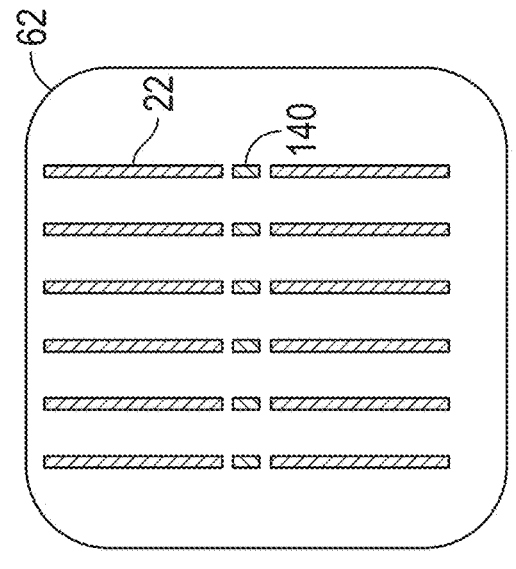
FIGS. 6B and 6C are schematic plan view illustrations of possible layouts for implementing the switching device of FIGS. 3 and 4.
Figure 6B:
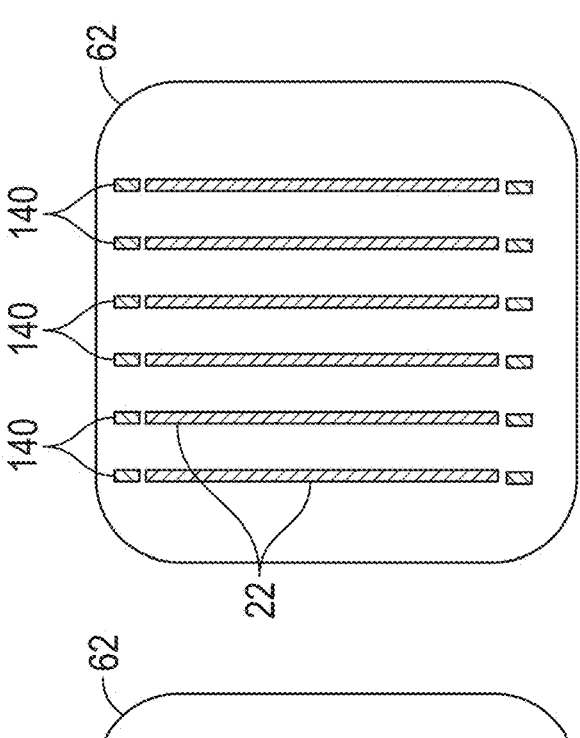
Figure 6A:
FIG. 6A is a schematic plan view illustration of a possible layout for implementing the switching device of FIG. 2.

FIG. 6A schematically illustrates a die area 62 for a representative switching device 20 as shown in FIGS. 2-4 in which the semiconductor power switch 22 is constructed on the die area with the above-noted stripe layout. As appreciated in the art, the illustrated stripe layout is commonly used when fabricating power MOSFETs and other semiconductor power switches 22. In a stripe layout, the power switches 22 are arranged in a series of parallel stripes. In this case, the lateral JFET 140 described above may be implemented in an adjacent parallel stripe to help ensure proximity to active regions of the power switches 22. FIGS. 6B and 6C likewise use a stripe layout, but instead situate the lateral JFETs 140 along an axis of each power stripe, either at the ends of the power stripes (FIG. 6B) or at the approximate midpoint of each stripe (FIG. 6C). In either case, the lateral JFET 140 is implemented along a same stripe as the power MOSFET. Such an approach may be suggested by the construction of FIG. 5.

Figure 7:
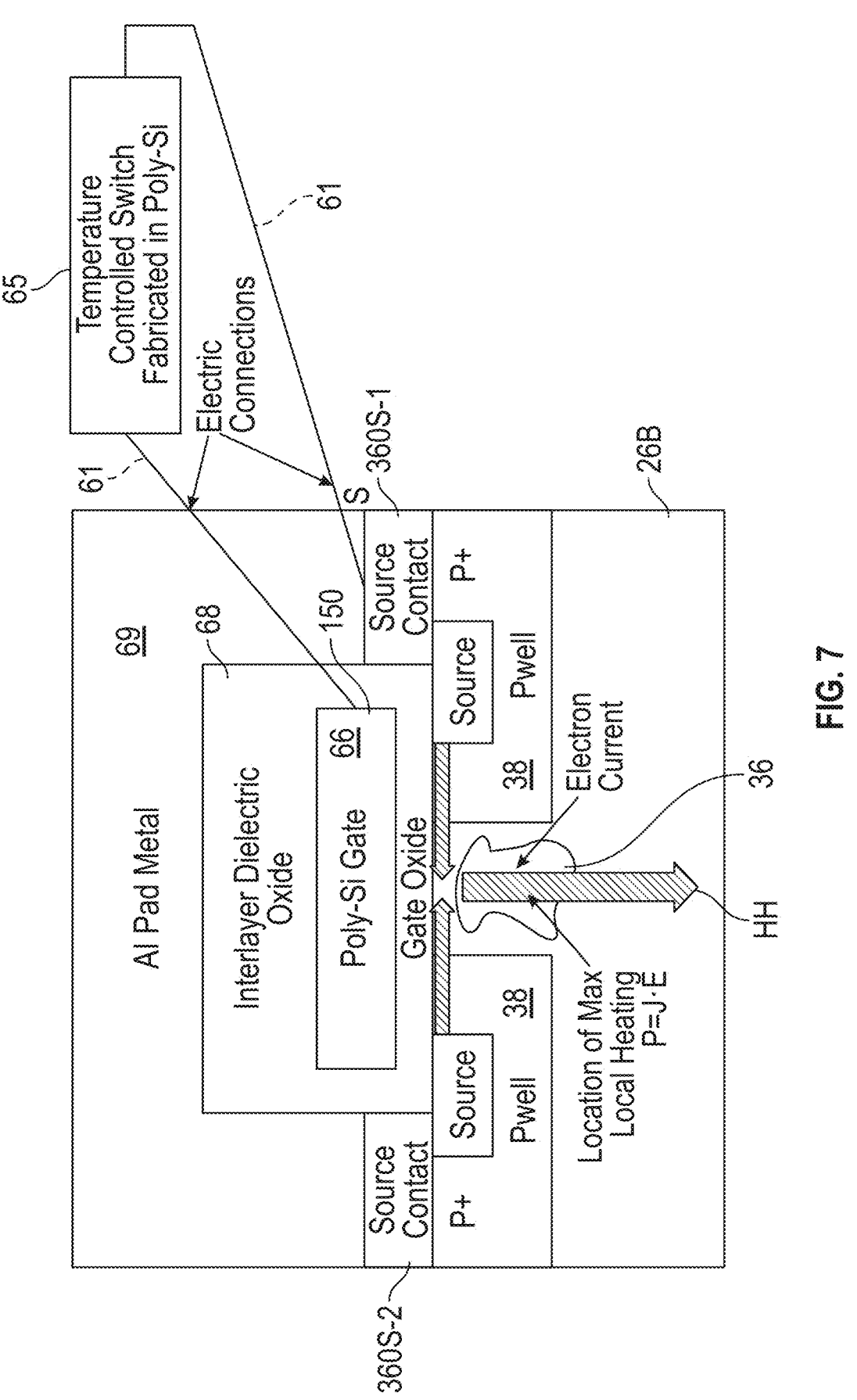
FIG. 7 is a schematic illustration of a possible layout of the switching device having a temperature-controlled (TC) gate switch according to yet another embodiment.

Referring now to FIG. 7, which generally corresponds to the "same stripe" construction of FIG. 6C, implementations may be contemplated in which the TSE 24 described above is embodied as a temperature-controlled (TC) switch 65 situated between a polysilicon (poly-Si) gate 66 and source contact 360S-1. Here, the active area 36 of the semiconductor power switch 22 is positioned in proximity to the TC switch 65 acting as a PN diode. In such an implementation, the TC switch 65 conducts an electric current in response to elevated local temperature during a short-circuit event to thereby short the poly-Si gate 66 and the source contact 360S-1. The power switch 22 thus turns off as described above.

In this construction, the poly-Si gate 66 may be encapsulated in an application specific interlayer dielectric oxide 68 and metal pad 69, e.g., aluminum (Al). The TC switch 65 may be connected by conductors 61 extending between the gate 66 and the source contact 360S-1. When a chip experiences rapid localized heating from an electron current during a short-circuit condition, as indicated by arrows HH, the TC switch 65 heats up rapidly by several hundred® C. In this case, the TC switch 65 closes to short the gate 66 and source contact 360S-1.

An arbitrary number of the TC switches 65 may be integrated into a given chip in different embodiments, with dimensions and doping concentrations of the TC switch 65 chosen to obtain turn-on at an application suitable temperature to achieve the desired short-circuit protection. Possible turn-on temperatures within the scope of the disclosure may fall within the range of about 300° C. to about 600° C., or about 400° C. to about 450° C.

Figures 8A, 8B, 8C:
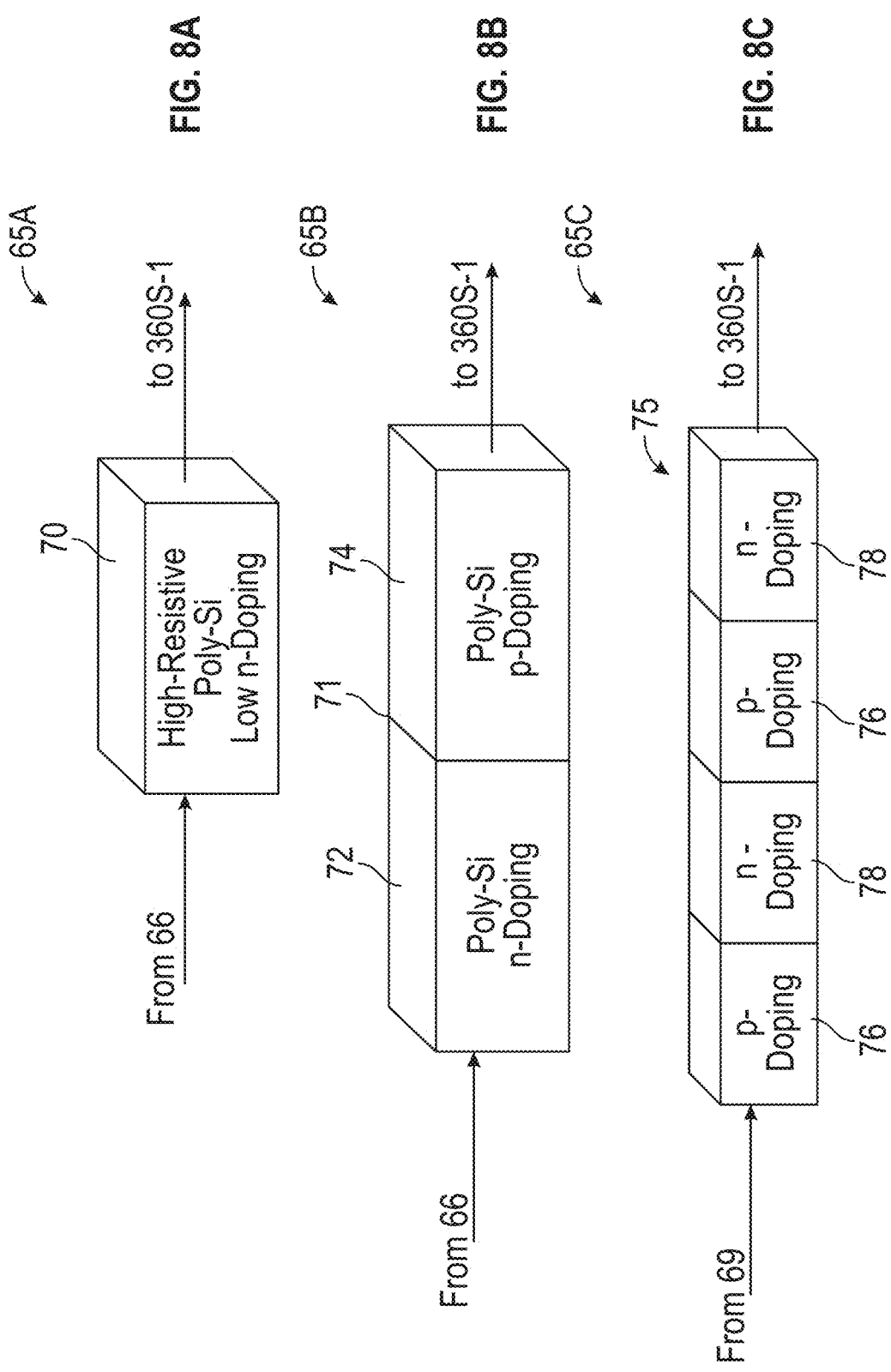
FIGS. 8A, 8B, and 8C illustrate representative embodiments of a TC gate switch as shown in FIG. 7.

As shown in FIGS. 8A, 8B, and 8C, for instance, the TC switch 65 may be variously implemented as a layer of high-resistive poly-Si material 70 having low levels of n-type impurities (TC switch 65A of FIG. 8A), which is then connected to the poly-Si gate 66 and the source contact 360S-2 as shown in FIG. 7. For instance, the poly-Si gate 66 may be connected to other poly-Si elements formed in the same deposited layer as the poly-Si gate 66, or in other deposited layers. An intrinsic, very lowly-doped poly-Si resistor, i.e., one in which the electrons gain sufficient energy to break free from their atomic bonds (through thermal excitation in this instance) and contribute to conductivity, has a low leakage current at normal operating temperatures. However, thermal generation as experienced during an overcurrent condition causes low resistance as the material becomes intrinsic at higher temperatures. The TC switch 65A thus turns on as a result of this temperature-induced change.

Alternatively as illustrated in FIG. 8B, the poly-Si gate 66 may be connected to a reverse-biased PN junction 71 formed from adjacent layers of poly-Si n-doped and p-doped layers 72 and 74. Such a PN junction 71 has a very low leakage current at normal temperatures, but loses its blocking capability as the n-layer or p-layer becomes intrinsic and the built-in potential disappears. This causes the TC switch 65B to turn on. Here, the p-doped layer 72 is connected to the source(S) and the n-doped layer 74 is connected to the poly-Si gate 66.

FIG. 8C and the TC switch 65C for its part illustrates yet another implementation in which a thyristor 75 is constructed from alternating p-doped and n-doped layers 76 and 78 to form a PNPN device. The thyristor 75 is connected between the metal pad 69 (FIG. 7) and the source 360S-1 in this embodiment. The triggering of a thyristor has a strong temperature dependence. Doping concentrations and length of the doped regions selected for implementing the thyristor 75 may be therefore configured to trigger at a suitable turn-on temperature.

As will be appreciated by those skilled in the art having the benefit of the present teachings, the inverter circuit 10 of FIG. 1 and other power electronic devices may benefit from use of SiC MOSFETs. However, existing SCWT requirements may be challenging to meet using purely active response techniques such as desaturation. Rather than penalizing Rdson as noted above, the solutions described herein allow for tradeoff between Rdson and SCWT by providing a passively-triggered response to local overtemperature conditions in active regions of the semiconductor power switch 22. These and other attendant benefits will be readily appreciated by those of ordinary skill in the art in view of the foregoing disclosure.

While several modes for carrying out the many aspects of the present teachings have been described in detail, those familiar with the art to which these teachings relate will recognize various alternative aspects for practicing the present teachings that are within the scope of the appended claims. The above description and accompanying drawings are illustrative and exemplary of the entire range of alternative embodiments that an ordinarily skilled artisan would recognize as implied by, structurally and/or functionally equivalent to, or otherwise rendered obvious based upon the included content, and not as limited solely to those explicitly depicted and/or described embodiments. Moreover, the present concepts expressly include combinations and sub-combinations of the described elements and features. The detailed description and the drawings are supportive and descriptive of the present teachings, with the scope of the present teachings defined solely by the claims.

What is claimed is:

1. A switching device, comprising:
   a semiconductor power switch having an active area and
   a normal operating temperature range; and a temperature sensitive element (TSE) connected to a gate terminal and a source terminal of the semiconductor power switch proximate the active area, wherein the TSE is structurally separate from the gate terminal of the semiconductor power switch and comprises a junction field-effect transistor (JFET) configured to provide an electrically conductive short-circuit path between the gate terminal and the source terminal of the semiconductor power switch when heated above a normal operating temperature range, such that conduction of an electric current through the JFET is (i) negligible when a temperature of the JFET is within the normal operating temperature range, and (ii) increases above the normal operating temperature range to a level sufficient for turning off the semiconductor power switch, thereby protecting the semiconductor power switch from thermal damage during an overcurrent event.

2. The switching device of claim 1, wherein:
the semiconductor power switch is a power metal-oxide semiconductor field-effect transistor (MOSFET).

3. The switching device of claim 2, wherein:
the MOSFET is a silicon carbide (SiC) power MOSFET.

4. The switching device of claim 3, wherein the JFET includes a lateral JFET having a source contact and a gate contact, and wherein the source contact and the gate contact of the lateral JFET are respectively connected to the source contact and the gate contact of the SiC power MOSFET.

5. The switching device of claim 3, wherein the JFET comprises a lateral JFET having a source contact and a gate contact that are each connected to the source contact of the SiC power MOSFET, and a drain contact that is connected to the gate contact of the SiC power MOSFET.

6. The switching device of claim 5, wherein the lateral JFET is a gated lateral JFET having a top gate structure that spans a channel region of the lateral JFET.

7. The switching device of claim 6, further comprising:
a control circuit configured to set the gate contact of the gated lateral JFET to a predetermined electric potential to thereby adjust a current-to-temperature sensitivity level of the gated lateral JFET.

8. The switching device of claim 7, wherein the control circuit includes a voltage divider circuit coupled to the source and the gate of the gated lateral JFET and the SiC power MOSFET.

9. The switching device of claim 6, wherein the top gate structure is constructed of a polysilicon material.

10. The switching device of claim 4, wherein the semiconductor switch has a stripe layout and the lateral JFET is implemented in an adjacent parallel stripe.

11. The switching device of claim 4, wherein the semiconductor switch has a stripe layout and the lateral JFET is implemented along a same stripe as the SiC power MOSFET.

12. A switching device, comprising:
a silicon carbide (SiC) power metal-oxide semiconductor field-effect transistor (MOSFET) having a source contact, a gate contact, a drain contact, a normal operating temperature range, and an active area; and
a lateral junction field-effect transistor (JFET) that is structurally separate from the gate contact of the SiC MOSFET, monolithically integrated with the SiC power MOSFET, and positioned proximate the active area, wherein an electrically conductive short-circuit path exists between the gate contact and the source contact of the SiC power MOSFET, through the lateral JFET, when the switching device is heated above a normal operating temperature range, and the lateral JFET is configured such that a conduction of current through an N-channel region of the lateral JFET is:
(i) less than about 1 milliamp (mA) when a temperature of the lateral JFET is within the normal operating temperature range of the SiC power MOSFET; and
(ii) increases above the normal operating temperature range to at least about 10 mA to short the gate contact and the source contact of the SiC power MOSFET and thereby turn off the SiC power MOSFET during an overcurrent event.

13. The switching device of claim 12, wherein the lateral JFET is a gated lateral JFET having a top gate structure spanning an N-channel channel region.

14. The switching device of claim 13, wherein a source of the lateral JFET and the top gate structure are electrically connected to the source of the SiC power MOSFET, and a drain of the lateral JFET is connected to a gate of the SiC power MOSFET.

15. The switching device of claim 13, further comprising:
a control circuit configured to adjust a current-to-temperature sensitivity level of the gated lateral JFET.

16. The switching device of claim 15, wherein the control circuit is connected to the gate contact of the gated lateral JFET and configured to set the top gate structure of the gated lateral JFET at a predetermined electric potential to adjust the current-to-temperature sensitivity level.

17. The switching device of claim 15, wherein the control circuit includes a voltage divider circuit.

18. The switching device of claim 13, wherein the top gate structure is constructed of a polysilicon material.

19. An inverter circuit for use with a direct current (DC) voltage supply and a polyphase motor, the inverter circuit comprising:
a positive voltage rail;
a negative voltage rail;
a DC link capacitor connected to the positive voltage rail and the negative voltage rail, and configured to receive a DC voltage waveform from the DC voltage supply; and
a plurality of switching devices arranged in multiple switching pairs, each of the multiple switching pairs being connectable to the DC link capacitor and a corresponding phase lead of the polyphase motor, wherein each respective one of the switching devices includes a semiconductor power switch that is monolithically integrated with a temperature sensitive element (TSE), the TSE comprising a JFET that is structurally separate from a gate contact of the semiconductor power switch, and wherein an electrically conductive short-circuit path exists between the gate contact and a source contact of semiconductor power switch when the JFET is heated above a normal operating temperature range, and the JFET is configured such that conduction of an electric current through the JFET is:
(i) negligible when a temperature of the TSE is within a normal operating temperature range of the semiconductor power switch; and
(ii) increases above the normal operating temperature range to a level sufficient for turning off the semiconductor power switch, thereby protecting the semiconductor power switch during an overcurrent event.

20. The inverter circuit of claim 19, wherein each respective one of the semiconductor power switches is a silicon carbide power metal-oxide semiconductor field-effect transistor.

* * * * *